(12) United States Patent
Su et al.

(10) Patent No.: US 11,469,359 B2
(45) Date of Patent: Oct. 11, 2022

(54) BACKPLANE AND GLASS-BASED CIRCUIT BOARD

(71) Applicants: BEIJING BOE DISPLAY TECHNOLOGY CO., LTD., Beijing (CN); BOE TECHNOLOGY GROUP CO., LTD., Beijing (CN)

(72) Inventors: Wengang Su, Beijing (CN); Wei Hao, Beijing (CN); Haiwei Sun, Beijing (CN); Lingyun Shi, Beijing (CN); Feifei Wang, Beijing (CN); Rui Shi, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 138 days.

(21) Appl. No.: 16/961,439

(22) PCT Filed: Sep. 30, 2019

(86) PCT No.: PCT/CN2019/109452
§ 371 (c)(1),
(2) Date: Jul. 10, 2020

(87) PCT Pub. No.: WO2021/062630
PCT Pub. Date: Apr. 8, 2021

(65) Prior Publication Data
US 2022/0005990 A1    Jan. 6, 2022

(51) Int. Cl.
*H01L 33/62* (2010.01)
*H01L 25/075* (2006.01)
(Continued)

(52) U.S. Cl.
CPC .............. *H01L 33/62* (2013.01); *H01L 23/48* (2013.01); *H01L 25/0753* (2013.01); *H01L 33/60* (2013.01)

(58) Field of Classification Search
CPC ......... H01L 23/48; H01L 33/62; H01L 33/60; H01L 25/0753
See application file for complete search history.

(56) References Cited

U.S. PATENT DOCUMENTS

2009/0316409 A1    12/2009  Kim et al.
2017/0150609 A1*   5/2017  Miwa .................... H05K 1/181
(Continued)

FOREIGN PATENT DOCUMENTS

CN    104241495    12/2014
CN    105355754    2/2016
(Continued)

*Primary Examiner* — Feifei Yeung Lopez
(74) *Attorney, Agent, or Firm* — Leason Ellis LLP

(57) ABSTRACT

A backplane and a glass-based circuit board. The backplane includes: a base substrate and a plurality of light-emitting units, arranged in an array on the base substrate. Each of the light-emitting units (110) includes at least one light-emitting sub-unit; the light-emitting sub-unit includes a connection line (200) and a plurality of light-emitting diode chips connected with the connection line, and the light-emitting diode chips are located on a side of the connection line away from the base substrate. The light-emitting diode chips (300) in the at least one light-emitting sub-unit are connected in series.

14 Claims, 6 Drawing Sheets

(51) Int. Cl.
  *H01L 33/60* (2010.01)
  *H01L 23/48* (2006.01)

(56) References Cited

U.S. PATENT DOCUMENTS

2017/0358724 A1* 12/2017 Shichijo ................ H01L 33/507
2020/0035147 A1    1/2020  Ban et al.

FOREIGN PATENT DOCUMENTS

| CN | 109031779 | 12/2018 |
| CN | 110225664 | 9/2019 |

* cited by examiner

BACKPLANE AND GLASS-BASED CIRCUIT BOARD

CROSS-REFERENCE TO RELATED PATENT APPLICATIONS

This application is a U.S. National Stage Application under 35 U.S.C. § 371 of International Patent Application No. PCT/CN2019/109452, filed Sep. 30, 2019, which is incorporated by reference in its entirety.

TECHNICAL FIELD

At least one embodiment of the present disclosure relates to a backplane and a glass-based circuit board.

BACKGROUND

With development of a micro light-emitting diode chip technology, backlight sources using micro light-emitting diode chips have been widely applied. In a general backlight source, a printed circuit board (PCB) is usually used to electrically connect a plurality of the micro light-emitting diode chips or electrically connect the micro light-emitting diode chips with other devices.

SUMMARY

At least one embodiment of the disclosure provides a backplane and a glass-based circuit board.

At least one embodiment of the disclosure provides a backplane, comprising a base substrate and a plurality of light-emitting units, arranged in an array on the base substrate. Each of the plurality of the light-emitting units comprises at least one light-emitting sub-unit; the at least one light-emitting sub-unit comprises a connection line and a plurality of light-emitting diode chips connected with the connection line; the plurality of the light-emitting diode chips are located on a side of the connection line away from the base substrate; and the plurality of the light-emitting diode chips in the at least one light-emitting sub-unit are connected in series.

In some examples, in each of the light-emitting sub-units, the connection line comprises a first connection portion and a second connection portion; the first connection portion comprises a first input end; the second connection portion comprises a second input end; and the first connection portion and the second connection portion respectively comprise an electrical contact point; the connection line further comprises a third connection portion; both ends of the third connection portion respectively comprise an electrical contact point; the electrical contact point at one end of the third connection portion and the electrical contact point of the first connection portion constitute an electrical contact point pair; the electrical contact point at the other end of the third connection portion and the electrical contact point of the second connection portion constitute an electrical contact point pair; and each of the electrical contact point pairs is respectively connected with an anode and a cathode of one of the plurality of the light-emitting diode chips in one-to-one correspondence.

In some examples, in each of the light-emitting sub-units, the third connection portion comprises a plurality of connection sub-portions; both ends of each of the connection sub-portions respectively comprise an electrical contact point; the electrical contact points at adjacent ends of adjacent connection sub-portions constitute an electrical contact point pair; each of the electrical contact point pairs is respectively connected with an anode and a cathode of one of the plurality of the light-emitting diode chips in one-to-one correspondence; and the plurality of the connection sub-portions are connected in series by the light-emitting diode chips.

In some examples, the plurality of the connection sub-portions comprise a first connection sub-portion and a second connection sub-portion, the first connection sub-portion extends along a first direction parallel to the base substrate; the first connection sub-portion has a shape in which notches are formed at two corners of a substantially rectangular shape that are opposite to each other in a diagonal direction; the first connection sub-portion comprises connection regions corresponding to the notches; and an electrical contact point of the first connection sub-portion is located on a side of the connection region facing the notch, the second connection sub-portion extends along the second direction parallel to the base substrate and intersecting with the first direction; electrical contact points of the second connection sub-portion are located at both end portions of the second connection sub-portion in the second direction.

In some examples, the light-emitting sub-unit comprises a plurality of first connection sub-portion rows extending along the first direction and arranged in the second direction; each of the first connection sub-portion rows comprises at least one first connection sub-portion; two end portions of the second connection sub-portion are respectively located in notches opposite to each other at end portions of adjacent first connection sub-portion rows, so that the adjacent first connection sub-portion rows are connected with each other by the second connection sub-portion and the light-emitting diode chips, the second connection sub-portions connected with a same first connection sub-portion row by the light-emitting diode chips are respectively located on both sides of the same first connection sub-portion row in the second direction and are respectively located at both ends of the same first connection sub-portion row in the first direction.

In some examples, each of the first connection sub-portion rows comprises a plurality of the first connection sub-portions; and a connection region of one first connection sub-portion of adjacent first connection sub-portions is located in the notch of the other first connection sub-portion of the adjacent first connection sub-portions, so that the adjacent connection regions are electrically connected by the light-emitting diode chip.

In some examples, each of the first connection sub-portion rows comprises a first end portion and a second end portion; the first end portions of the plurality of the connection sub-portion rows are aligned in the second direction; the second end portions of the plurality of the first connection sub-portion rows are aligned in the second direction; and the plurality of the first connection sub-portion rows and the second connection sub-portions are integrally connected in a square wave shape.

In some examples, except the connection regions located at both ends of the first connection sub-portion row, the first connection sub-portion row has a substantially equal size in the second direction at respective positions in the first direction.

In some examples, the first connection portion comprises a first protrusion portion; the first protrusion portion is located within a notch at a connection region of the first connection sub-portion row connected with the first protrusion portion by the light-emitting diode chip; the second connection portion comprises a second protrusion portion; and the second protrusion portion is located within a notch at a connection region of the first connection sub-portion row connected with the second protrusion portion by the light-emitting diode chip.

In some examples, the at least one light-emitting sub-unit comprises a plurality of light-emitting sub-units; and the plurality of the light-emitting sub-units of each of the light-emitting units share the first connection portion and the second connection portion, so that the plurality of the light-emitting sub-units are connected in parallel.

In some examples, the light-emitting diode chips in each of the light-emitting units are evenly distributed.

In some examples, the two connection portions constituting the electrical contact point pair have a space therebetween, and an orthogonal projection of the light-emitting diode chip on the base substrate at least partially overlaps with an orthogonal projection of the space on the base substrate.

In some examples, the backplane further comprises a reflective layer, located between the connection line and the light-emitting diode chip.

In some examples, the backplane further comprises a plurality of wirings parallel to each other, located on a side of the connection line facing the base substrate, and including a plurality of first wirings and a plurality of second wirings; a first insulation layer, located between the plurality of the wirings parallel to each other and the connection line; a second insulation layer, located between the reflective layer and the connection line, to isolate the reflective layer and the connection line from each other. The first input end of the connection line is connected with the first wiring, and the second input end of the connection line is connected with the second wiring.

In some examples, a thickness of the wiring is greater than a thickness of the connection line, and widths of both of the first connection portion and the second connection portion are greater than a width of the wiring.

In some examples, the backplane further comprises a white glue layer, on a side of the reflective layer away from the base substrate, and having an opening exposing the light-emitting diode chips; a transparent layer, on a side of the white glue layer away from the base substrate to cover the white glue layer and the light-emitting diode chips.

At least one embodiment of the present disclosure provides a glass-based circuit board, comprising a glass substrate; and a plurality of connection line units, arranged in an array on the glass substrate. Each of the connection line units comprises at least one connection line sub-unit; the connection line sub-unit comprises a plurality of electrical contact point pairs; each of the electrical contact point pairs is configured to be connected with an anode and a cathode of a light-emitting diode chip in one-to-one correspondence, so that a plurality of the light-emitting diode chips connected with the plurality of the electrical contact point pairs are connected in series.

In some examples, the connection line sub-unit comprises a first connection portion and a second connection portion; the first connection portion comprises a first input end; the second connection portion comprises a second input end; and the first connection portion and the second connection portion respectively comprise an electrical contact point; the connection line sub-unit further comprises a third connection portion; both ends of the third connection portion respectively comprise an electrical contact point; the electrical contact point at one end of the third connection portion and the electrical contact point of the first connection portion constitute the electrical contact point pair; the electrical contact point at the other end of the third connection portion and the electrical contact point of the second connection portion constitute the electrical contact point pair.

In some examples, in each of the connection line sub-units, the third connection portion comprises a plurality of connection sub-portions; both ends of each of the connection sub-portions respectively comprise an electrical contact point; the plurality of the connection sub-portions are adjacent head to tail, so that adjacent electrical contact points of the adjacent connection sub-portions constitute the electrical contact point pair.

In some examples, the plurality of the connection sub-portions comprise a first connection sub-portion and a second connection sub-portion, the first connection sub-portion extends along a first direction parallel to the glass substrate; the first connection sub-portion has a shape in which notches are formed at two corners of a substantially rectangular shape that are opposite to each other in a diagonal direction; the first connection sub-portion comprises connection regions corresponding to the notches; and an electrical contact point of the first connection sub-portion is located on a side of a connection region facing the notch, the second connection sub-portion extends along a second direction parallel to the glass substrate and intersecting with the first direction; electrical contact points of the second connection sub-portion are located at both end portions of the second connection sub-portion in the second direction.

In some examples, the connection line sub-unit comprises a plurality of first connection sub-portion rows extending along the first direction and arranged in the second direction; each of the first connection sub-portion rows comprises at least one first connection sub-portion; two end portions of the second connection sub-portion are respectively located in notches at end portions of adjacent first connection sub-portion rows, so that the electrical contact points at the two end portions of the second connection sub-portion respectively constitute the electrical contact point pair with the electrical contact point of an adjacent first connection sub-portion row, the second connection sub-portions forming the electrical contact point pairs with a same first connection sub-portion row are respectively located on both sides of the first connection sub-portion row in the second direction and are respectively located at both ends of the first connection sub-portion row in the first direction.

In some examples, each of the first connection sub-portion rows comprises a plurality of first connection sub-portions; and a connection region of one first connection sub-portion of adjacent first connection sub-portions is located in a notch of the other first connection sub-portion.

In some examples, except the connection regions located at both ends of the first connection sub-portion row, the first connection sub-portion row has a substantially equal size in the second direction at respective positions in the first direction.

In some examples, the first connection portion comprises a first protrusion portion, the electrical contact point of the first connection portion is located on the first protrusion portion, and the first protrusion portion is located within a notch corresponding to a connection region of the first connection sub-portion row adjacent to the first connection portion, so that an electrical contact point on the first protrusion portion and an electrical contact point in the connection region of the first connection sub-portion row constitute the electrical contact point pair; the second connection portion comprises a second protrusion portion, an electrical contact point of the second connection portion is located on the second protrusion portion, and the second protrusion portion is located within a notch corresponding to a connection region of the first connection sub-portion row adjacent to the second protrusion portion, so that the electrical contact point on the second protrusion portion and an electrical contact point in the connection region of the first connection sub-portion row constitute the electrical contact point pair.

In some examples, the at least one connection line sub-unit comprises a plurality of connection line sub-units; and the plurality of the connection line sub-units in each of the connection line units share the first connection portion and the second connection portion.

In some examples, the electrical contact point pairs in each of the connection line units are evenly distributed.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects.

Embodiments of the present disclosure provide a backplane and a glass-based circuit board. The backplane comprises a base substrate and a plurality of light-emitting units arranged in an array on the base substrate. Each of the light-emitting units comprises a connection line and a plurality of light-emitting diode chips connected with the connection line; and the light-emitting diode chips are located on a side of the connection line away from the base substrate. Each of the light-emitting units comprises at least one light-emitting sub-unit, and the light-emitting diode chips in the light-emitting sub-unit are connected in series. In the embodiment of the present disclosure, the connection line unit is used to connect the light-emitting diode chips in the light-emitting sub-unit in series, which can increase space utilization of the backplane and reduce driving costs.

Hereinafter, the backplane and the glass-based circuit board provided by the embodiments of the present disclosure will be described in conjunction with the accompanying drawings.

Figure 1:
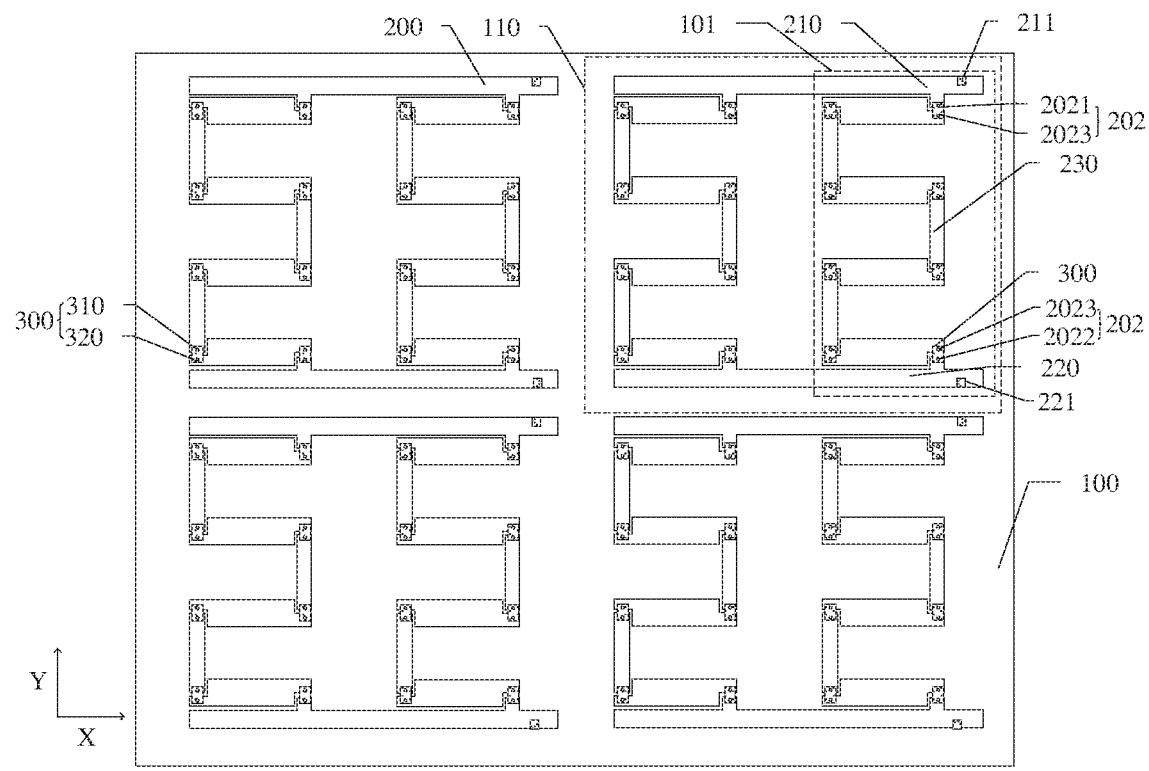
FIG. 1 is a partial planar structural schematic diagram of a backplane provided by an embodiment of the present disclosure.
Figure 2:
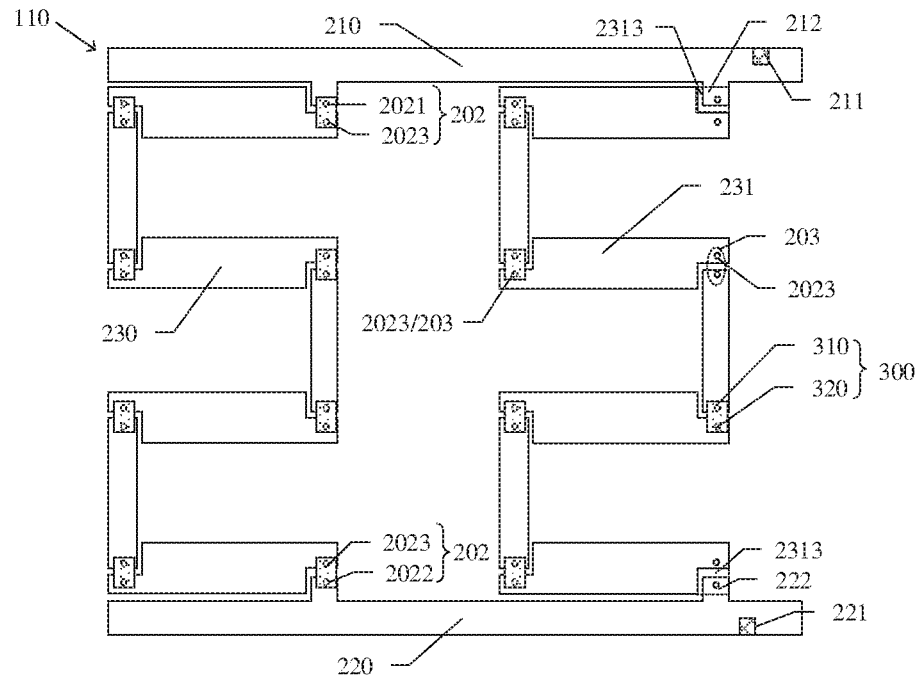
FIG. 2 is a planar structural schematic diagram of a light-emitting unit in the backplane shown in FIG. 1.

FIG. 1 is a partial planar structural schematic diagram of a backplane provided by an embodiment of the present disclosure; and FIG. 2 is a planar structural schematic diagram of the light-emitting unit in the backplane shown in FIG. 1. As shown in FIG. 1 and FIG. 2, the backplane comprises a base substrate 100 and a plurality of light-emitting units 110 arranged in an array on the base substrate 100. Each of the light-emitting units 110 comprises a connection line 200 and a plurality of light-emitting diode chips 300 connected with the connection line 200; and the light-emitting diode chips 300 are located on a side of the connection line 200 away from the base substrate 100. Each of the light-emitting units 110 comprises at least one light-emitting sub-unit 101, and light-emitting diode chips 300 in the light-emitting sub-unit 101 are connected in series. In the embodiment of the present disclosure, the connection line unit is used to connect the light-emitting diode chips in the light-emitting sub-unit in series, which can increase space utilization of the backplane, improve efficiency, help maintain product consistency, and reduce driving costs.

For example, the light-emitting diode chips 300 can be micro light-emitting diode chips, and be arranged in an array on the base substrate 100. For example, a maximum size of the micro light-emitting diode chip 300 in a direction parallel to the base substrate 100 is not greater than 100 microns.

For example, the light-emitting diode chips 300 can also be mini light-emitting diode chips (mini LEDs), and be arranged in an array on the base substrate 100. For example, a maximum size of the mini LED 300 in the direction parallel to the base substrate 100 is not greater than 500 microns. For example, a size of the mini LED 300 can be 0.2 mm×0.4 mm.

For example, the backplane provided by the embodiment of the present disclosure can be used as a backlight source, or can also be used as a display panel, which will not be limited in the embodiment of the present disclosure.

In some examples, the base substrate 100 is a glass substrate.

In the study, an inventor of the present application finds that: a substrate of a single PCB board is prone to a warpage problem, so, in a process of fabricating a large-sized backplane, a plurality of PCB boards are required be spliced, to ensure that an entire circuit board comprised in the backplane has relatively high flatness. However, the splicing of the plurality of the PCB boards will increase fabrication and driving costs. In addition, poor heat dissipation performance of the substrate of the PCB board (of which a thermal diffusion coefficient is 0.4 W/m·K) will cause the backplane to be prone to defects due to an excessively high temperature during operation.

In one embodiment of the present disclosure, a glass substrate provided with a circuit connection unit is used instead of a commonly used substrate, for example, a PCB board for electrically connecting light-emitting diode chips in a backlight source, which can overcome the problem of poor heat dissipation performance of a general PCB substrate; in addition, because the glass substrate is not easily deformed, only one large-sized glass substrate is required to be used in a process of fabricating a large-sized backplane, without splicing a plurality of substrates, which can reduce fabrication costs and driving costs.

In some examples, as shown in FIG. 1 and FIG. 2, in each of the light-emitting sub-units 101, a connection line 200 comprises a first connection portion 210 and a second connection portion 220; the first connection portion 210 comprises a first input end 211; and the second connection portion comprises a second input end 221. The connection line 200 in each of the light-emitting sub-units 101 connects a plurality of the light-emitting diode chips 300 in series.

In some examples, as shown in FIG. 1 and FIG. 2, the first connection portion 210 and the second connection portion 220 each comprise an electrical contact point, for example, the first connection portion 210 comprises a first electrical contact point 2021, and the second connection portion 220 comprises a second electrical contact point 2022. In each of the light-emitting sub-units 101, the connection line 200 further comprises a third connection portion 230, and both ends of the third connection portion 230 each comprise one electrical contact point, for example, both ends of the third connection portion 230 each comprise a third electrical contact point 2023. The third electrical contact point 2023 at one end of the third connection portion 230 and the first electrical contact point 2021 of the first connection portion 210 constitute an electrical contact point pair 202; the third electrical contact point 2023 at the other end of the third connection portion 230 and the second electrical contact point 2022 of the second connection portion 220 constitute an electrical contact point pair 202; and each of the electrical contact point pairs 202 is respectively connected with an anode 310 and a cathode 320 of the light-emitting diode chip 300 in one-to-one correspondence.

For example, as shown in FIG. 1 and FIG. 2, each of the light-emitting sub-units 101 comprises a first connection portion 210, a second connection portion 220, a third connection portion 230, and a plurality of light-emitting diode chips 300, that is, the light-emitting sub-unit has a connection from a first input end 211 of the first connection portion 210, by the light-emitting diode chips 300 and the third connection portion 230, to a second input end 221 of the second connection portion 220, so that the light-emitting diode chips 300 of the light-emitting sub-unit 110 are connected in series.

For example, as shown in FIG. 1 and FIG. 2, the first connection portion 210, the second connection portion 220 and the third connection portion 230 are provided in a same layer and made of a same material. The "same layer" here and later refers to a relationship between a plurality of film layers formed of a same material after a same step (e.g., a one-step patterning process). For example, a metal layer can be deposited firstly, and then the metal layer is patterned to form the respective connection portions. The "same layer" here does not always refer to that thicknesses of the plurality of the film layers are equal or heights of the plurality of the film layers in a cross-sectional view are equal.

For example, materials of the respective connection portions can all be copper, but are not limited thereto, and can also be other conductive materials.

For example, an insulation layer (a first insulation layer 700 shown in FIG. 8) is provided between the light-emitting diode chips 300 and the connection line 200, and the anodes 310 and the cathodes 320 of the light-emitting diode chips 300 can respectively connected with the electrical contact points of the connection line 200 correspondingly through via holes located in the insulation layer, so that the connection line 200 functions to electrically connect the light-emitting diode chips 300. The electrical contact points on the respective connection portions refer to the electrical connection points where the anodes or the cathodes of the light-emitting diode chips 300 are connected to the connection portions through via holes. For example, the electrical contact point can be a portion of the connection portion which is used for electrical connecting with the anode or the cathode of the light-emitting diode chip 300, for example, the electrical contact point 2021 on the first connection portion 210 shown in FIG. 8 later.

In some examples, as shown in FIG. 1 and FIG. 2, the two connection portions constituting the electrical contact point pair have a space therebetween, and an orthogonal projection of the light-emitting diode chip 300 on the base substrate 100 at least partially overlaps with an orthogonal projection of the space on the base substrate 100. For example, orthogonal projections of the anode 310 and the cathode 320 of the light-emitting diode chip 300 on the base substrate 100 can be located within an orthogonal projection of the connection portion on the base substrate 100, but are not limited thereto, provided the anode and the cathode of the light-emitting diode chip are respectively electrically connected to adjacent connection portions.

For example, in a film layer where the respective connection portions are located, there is no connection between the adjacent connection portions, and the light-emitting diode chip electrically connected with the adjacent connection portions connects the adjacent connection portions. That is to say, in the film layer where the respective connection portions are located, the adjacent connection portions are spaced apart from each other. For example, a space between the adjacent connection portions can be filled with an insulation material.

In some examples, as shown in FIG. 1 and FIG. 2, in each of the light-emitting sub-units 101, the third connection portion 230 comprises a plurality of connection sub-portions 231; and both ends of each of the connection sub-portions 231 each comprise one electrical contact point, for example, a third electrical contact point 2023, for electrical connecting with the anode 310 or the cathode 320 of the light-emitting diode chip 300. The third electrical contact points 2023 at adjacent ends of the adjacent connection sub-portions 231 constitute an electrical contact point pair 203; two electrical contact points in each of the electrical contact point pairs 203 are respectively connected with the anode 310 and the cathode 320 of the light-emitting diode chip 300 in one-to-one correspondence; and the plurality of the connection sub-portions 231 are connected head to tail by the light-emitting diode chips 300, that is, the plurality of the connection sub-portions 231 are connected in series. The above-described expression "adjacent ends of the adjacent connection sub-portions" refers to that closely adjacent portions of the adjacent connection sub-portions are respectively end portions of the two connection sub-portions. The above-described expression that "the plurality of the connection sub-portions are connected head to tail by the light-emitting diode chips" refers to that a head end of one connection sub-portion is connected to a tail end of another connection sub-portion by the light-emitting diode chip; and the plurality of the connection sub-portions are connected sequentially.

It should be noted that, in order to clearly illustrate the electrical contact points on the connection portion, a part of the light-emitting diode chips in FIG. 2 are not shown.

Figure 3:
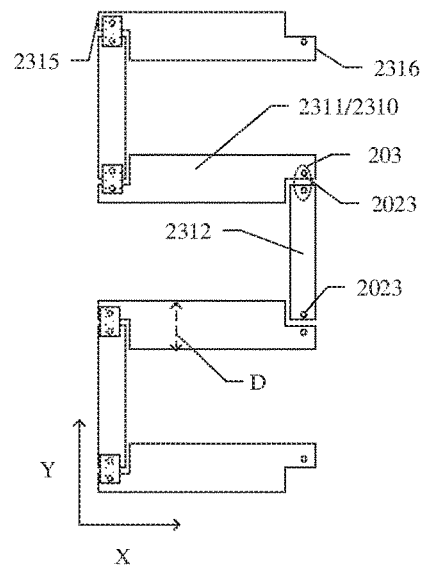
FIG. 3 is a planar structural schematic diagram of a third connection portion in the light-emitting sub-unit shown in FIG. 2.
Figure 4:
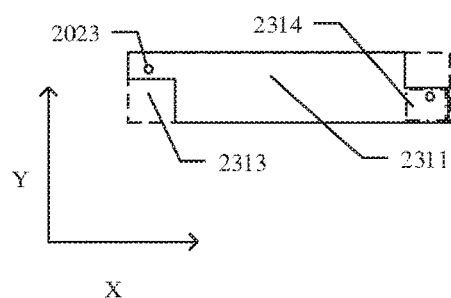
FIG. 4 is a planar structural schematic diagram of the first connection sub-portion shown in FIG. 3.

FIG. 3 is a schematic diagram of a third connection portion in the connection line in the light-emitting sub-unit in FIG. 2, and FIG. 4 is a schematic diagram of the first connection sub-portion in FIG. 3. In order to clearly illustrate a position relationship between the electrical contact points on the connection sub-portions and the adjacent connection sub-portions, FIG. 3 shows a part of the light-emitting diode chips.

In some examples, as shown in FIG. 1 to FIG. 4, the plurality of the connection sub-portions 231 comprise first connection sub-portions 2311 and second connection sub-portions 2312. The plurality of the connection sub-portions 231 can be divided into a plurality of the first connection sub-portions 2311 and a plurality of the second connection sub-portions 2312. That is to say, a certain connection sub-portion 231 can be the first connection sub-portion 2311, or a certain connection sub-portion 231 can be the second connection sub-portion 2312. The first connection sub-portion 2311 extends along a first direction (i.e., an X direction) parallel to the base substrate 100. The first connection sub-portion 2311 has an irregular shape, in which notches 2313 are formed at two corners of a substantially rectangular shape (dashed frames shown in FIG. 4) that are opposite to each other in a diagonal direction. For example, the first connection sub-portion 2311 has a shape obtained by cutting off the two rectangular corners opposite to each other in the diagonal direction. The above-described expression "substantially rectangular shape" refers to that a shape constituted by the first connection sub-portion and the notches can be a standard right-angled rectangle, or can also be an approximate rectangle such as a rounded rectangle.

For example, as shown in FIG. 1 to FIG. 4, a shape of the notch 2313 can be a rectangle, but is not limited thereto.

In some examples, as shown in FIG. 1 to FIG. 4, the first connection sub-portion 2311 comprises connection regions 2314 (regions shown by dashed lines) corresponding to the notches 2313; and an electrical contact point 2023 of the first connection sub-portion 2311 is located on a side of the connection region 2314 facing the notch 2313. The above-described expression "connection regions corresponding to the notches" refers to portions of the first connection sub-portion 2311 which are adjacent to the notches 2313 in the Y direction. The connection regions 2314 are just two corners reserved at two substantially rectangular corners opposite to each other in the diagonal direction, that is, the two opposite corners of the above-described rectangle that are not cut off. The electrical contact points 2023 are located in positions of the connection regions 2314 which are close to the notches 2313 adjacent thereto.

For example, as shown in FIG. 1 to FIG. 4, a plurality of the light-emitting diode chips 300 in each of the light-emitting unit 110 have a same orientation from the anode 310 to the cathode 320.

For example, the orientation from the cathode 320 to the anode 310 of each of the light-emitting diode chip 300 is a direction indicated by an arrow of the Y direction in FIG. 1 to FIG. 4, then, in order that the light-emitting diode chips 300 located in the light-emitting sub-unit 101 among the whole light-emitting diode chips 300 arranged in an array are connected in series, one of the two connection regions 2314 of the first connection sub-portion 2311 is required to be connected with an anode 310 of one light-emitting diode chip 300, and the other connection region 2314 is required to be connected with a cathode 320 of another light-emitting diode chip 300. Thus, the two connection regions 2314 of the first connection sub-portion 2311 are respectively located on both sides of the first connection sub-portion 2311 in the Y direction and at both ends of the first connection sub-portion 2311 in the X direction.

For example, as shown in FIG. 1 to FIG. 4, a size of a portion of the first connection sub-portion 2311 other than the connection regions 2314 at respective positions is equal in the Y direction. For example, the portion of the first connection sub-portion 2311 other than the connection regions 2314 can be a rectangle.

For example, as shown in FIG. 1 to FIG. 4, the first connection sub-portion 2311 can comprise a rectangular central portion as well as a first edge portion and a second edge portion respectively located on both sides of a first central line of the rectangular central portion that extends along the Y direction. Along the Y direction, sizes of the first edge portion and the second edge portion are both smaller than a size of the central portion; and edges of the first edge portion and the second edge portion that are away from a second central line of the central portion that extends along the X direction are aligned with edges of the central portion that extend along the X direction. Here, the first edge portion and the second edge portion are just the connection regions 2314 in FIG. 4, and the central portion is the portion of the first connection sub-portion other than the connection regions.

In some examples, as shown in FIG. 1 to FIG. 4, the second connection sub-portion 2312 extends along the second direction (the Y direction) parallel to the base substrate 100 and intersecting with the first direction (the X direction); the electrical contact points 2023 of the second connection sub-portion 2312 are located at both end portions of the second connection sub-portion 2312 in the second direction. The electrical contact point pair 203 constituted by the electrical contact point 2023 of the second connection sub-portion 2312 and the electrical contact point 2023 of an adjacent first connection sub-portion 2311 is configured to connect the plurality of the light-emitting diode chips 300 in series.

In some examples, as shown in FIG. 1 to FIG. 4, the light-emitting sub-unit 101 comprises a plurality of first connection sub-portion rows 2310 extending along the first direction and arranged in the second direction; each of the first connection sub-portion rows 2310 comprises at least one first connection sub-portion 2311. FIG. 3 schematically shows that the first connection sub-portion row 2310 comprises one first connection sub-portion 2311. Two end portions of the second connection sub-portion 2312 are respectively located in notches 2313 opposite to each other at end portions of adjacent two first connection sub-portion rows 2310, so as to connect the adjacent first connection sub-portion rows 2310 by the light-emitting diode chips 300. That is, an end portion of the second connection sub-portion 2312 extends into the notch 2313 of the first connection sub-portion 2311, so that the third electrical contact point 2023 located at the end portion of the second connection sub-portion 2312 can constitute the electrical contact point pair 203 with the third electrical contact point 2023 located in the connection region 2314 of the first connection sub-portion 2311.

In some examples, as shown in FIG. 1 to FIG. 4, the second connection sub-portions 2312 connected with a same first connection sub-portion row 2310 by the light-emitting diode chips 300 are respectively located on both sides of the first connection sub-portion row 2310 in the second direction and are respectively located at both ends of the first connection sub-portion row 2310 in the first direction. An example in which one first connection sub-portion row 2310 comprises one first connection sub-portion 2311 is illustrated. Because two notches 2313 of the first connection sub-portion 2311 are respectively located on both sides of the first connection sub-portion 2311 in the Y direction and located at both ends of the first connection sub-portion 2311 in the X direction, the two second connection sub-portions 2312 connected with the first connection sub-portion 2311 by the light-emitting diode chips 300 are respectively located on both sides of the first connection sub-portion 2311 in the Y direction and located at both ends of the connection sub-portion 2311 in the X direction.

Figure 5:
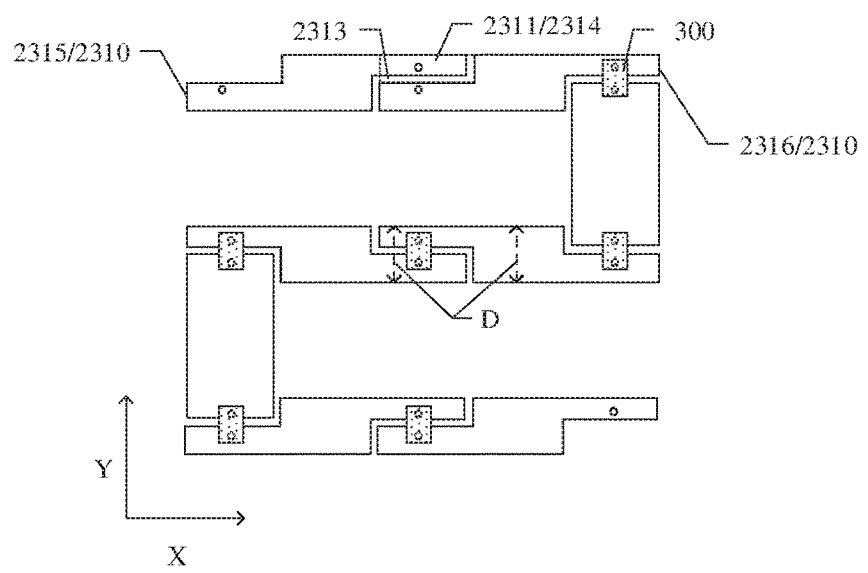
FIG. 5 is a partial structural schematic diagram of a light-emitting sub-unit provided by another example of the embodiment of the present disclosure.

FIG. 5 is a partial structural schematic diagram of a light-emitting sub-unit comprised in a backplane provided by another example of the embodiment of the present disclosure. As shown in FIG. 5, each of the first connection sub-portion rows 2310 can comprise a plurality of the first connection sub-portions 2311; and a connection region 2314 of one first connection sub-portion 2311 of adjacent first connection sub-portions 2311 is located in a notch 2313 of the other first connection sub-portion 2311 of the adjacent first connection sub-portions 2311, so that adjacent connection regions 2314 are connected by the light-emitting diode chip 300. For example, the expression that adjacent connection regions are connected by the light-emitting diode chip can be that the adjacent connection regions are electrically connected by the light-emitting diode chip. A connection region 2314 of one first connection sub-portion 2311 of the adjacent first connection sub-portions 2311 extends into a notch 2313 of the other first connection sub-portion 2311 of the adjacent first connection sub-portions 2311, so that electrical contact points on the two connection regions 2314 adjacent to each other of the two first connection sub-portions 2311 are respectively electrically connected with an anode and a cathode of the light-emitting diode chip 300. That is, the adjacent first connection sub-portions 2311 in the first connection sub-portion row 2310 have complementary shapes in a position where the connection is implemented by the light-emitting diode chip 300.

In some examples, as shown in FIG. 3 to FIG. 5, each of the first connection sub-portion rows 2310 comprises a first end portion 2315 and a second end portion 2316; first end portions 2315 of the plurality of the connection sub-portion rows 2310 are aligned in the second direction; the second end portions 2316 of the plurality of the connection sub-portion rows 2310 are aligned in the second direction; and the plurality of the first connection sub-portion rows 2310 and the second connection sub-portions 2312 are integrally connected in a square wave shape to efficiently utilize the space of the backplane.

For example, as shown in FIG. 3 to FIG. 5, an edge of the second connection sub-portion 2312 away from the first connection sub-portion 2310 and extending along the Y direction is aligned with the first end portion 2315 or the second end portion 2316 of the first connection sub-portion row 2310.

In some examples, as shown in FIG. 3 to FIG. 5, except the connection regions 2314 located at both ends of the first connection sub-portion row 2310, a size D of the first connection sub-portion row 2310 at respective positions in the first direction is substantially equal in the second direction. The expression "substantially equal" here and later refers to that, a ratio of a size difference at respective positions along the second direction to a size at the respective positions is not greater than 5%. When the first connection sub-portion row 2310 comprises a plurality of the first connection sub-portions 2311, along the Y direction, a total size of two connection regions 2314 forming the electrical contact point pair 203 in adjacent first connection sub-portions 2311 and a space between the two connection regions 2314 is equal to a size of a portion of a first connection sub-portion 2311 other than the connection regions 2314, to efficiently utilize the space of the backplane.

In some examples, as shown in FIG. 1 to FIG. 2, at least one light-emitting unit 110 comprises a plurality of light-emitting sub-units 101; and the plurality of the light-emitting sub-units 101 share the first connection portion 210 and the second connection portion 220, so as to be connected in parallel, that is, the plurality of the light-emitting sub-units 101 share the first connection portion 210 and the second connection portion 220, so that the plurality of the light-emitting sub-units 101 are connected in parallel. FIG. 1 schematically shows that two light-emitting units 110 adjacent in the first direction have first connection portions and the second connection portions both separated from each other, but it is not limited thereto. In order to reduce the number of wirings connecting the cathodes of the light-emitting diode chips to the circuit board (e.g., a printed circuit board), second connection portions (an example in which the second connection portions are connected with the cathodes of the light-emitting diode chips is illustrated) of at least two light-emitting units arranged in the first direction can also be electrically connected. Similarly, the second connection portions of at least two light-emitting units arranged in the second direction can be connected to a same cathode wiring to save the number of the wirings and reduce the fabrication process costs.

For example, in one example of the embodiment of the present disclosure, a plurality of the light-emitting sub-units 101 in each of the light-emitting units 110 are connected in parallel; and a plurality of the light-emitting diode chips 300 in each of the light-emitting sub-units 101 are connected in series.

Figure 6:
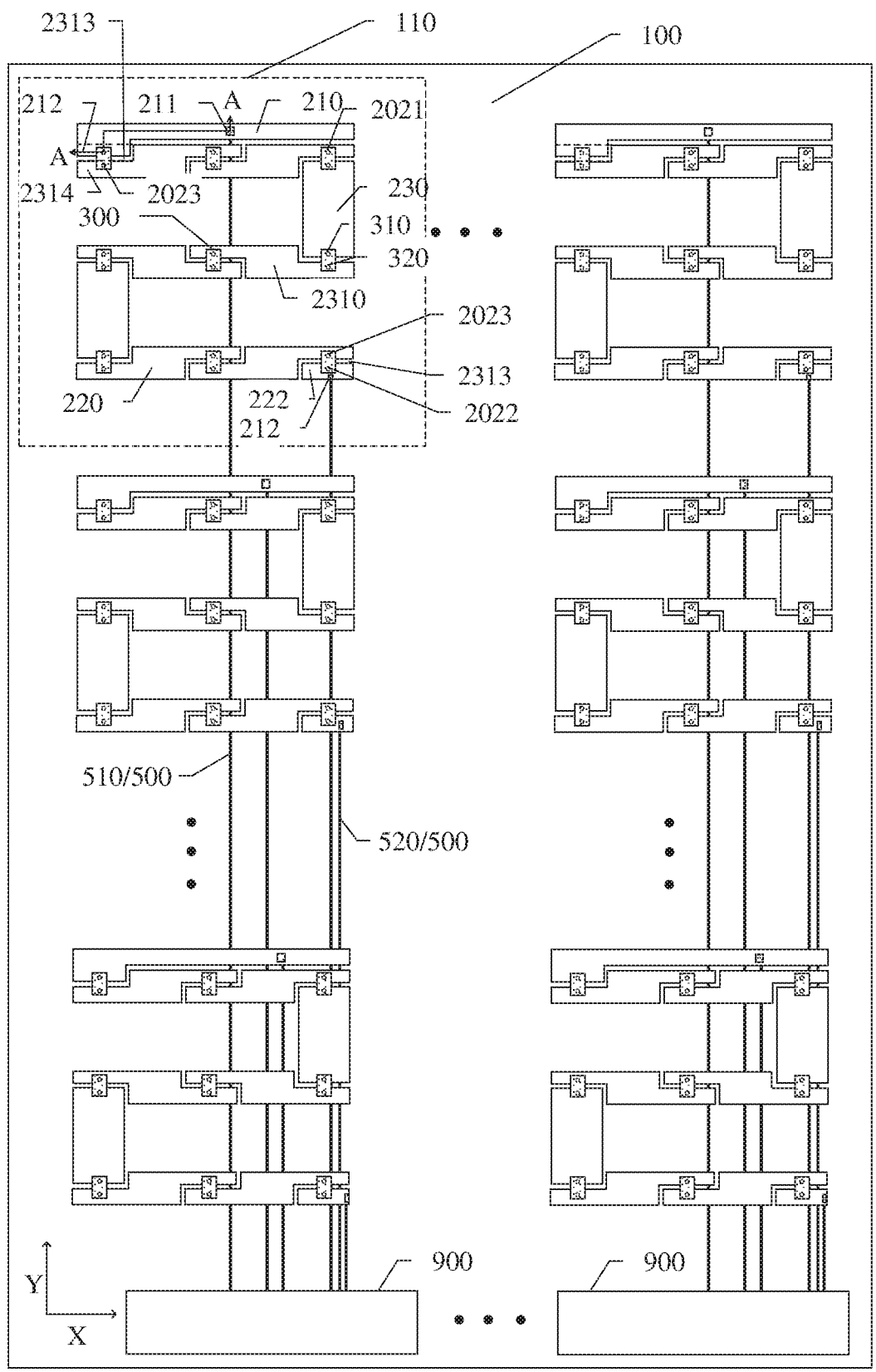
FIG. 6 is a partial planar structural schematic diagram of a backplane provided by another example of the embodiment of the present disclosure.

FIG. 6 is a partial planar structural schematic diagram of a backplane provided by another example of the embodiment of the present disclosure. As shown in FIG. 6, the backplane in the example differs from the backplane shown in FIG. 1 in that: each of the light-emitting units 110 in the example comprises only one light-emitting sub-unit, then, a plurality of light-emitting diode chips 300 in the light-emitting unit 110 are connected in series by a first connection portion 210, a second connection portion 220, and a third connection portion 230 comprised in the connection line 200. FIG. 6 schematically shows that second connection portions of adjacent two light-emitting units 110 arranged in the second direction are connected to different cathode wirings, but it is not limited thereto. In order to reduce the number of the wirings for connecting the cathodes of the light-emitting diode chips to the circuit board (e.g., a printed circuit board), the second connection portions of at least two light-emitting units arranged in the second direction can also be connected to a same cathode wiring, so as to save the number of the wirings and reduce the fabrication process costs.

In the embodiment of the present disclosure, a glass substrate provided with a circuit connection unit, for example, a PCB board for electrically connecting light-emitting diode chips in a backlight source, is used instead of a conventional substrate, and a purpose for fabricating more light regions on only one glass substrate can be achieved without splicing a plurality of substrates, which saves costs.

As shown in FIG. 1 to FIG. 2, the first connection portion 210 comprises a first protrusion portion 212; and the first protrusion portion 212 is located within a notch 2313 at a connection region 2314 of a first connection sub-portion row 2310 connected with the first protrusion portion 212 by the light-emitting diode chip 300. A first electrical contact point 2021 of the first connection portion 210 is located in the first protrusion portion 212; and the first protrusion portion 212 extends into the notch 2313 of the first connection sub-portion row 2310, so that the first electrical contact point 2021 of the first connection portion 210 and a third electrical contact point 2023 of a third connection portion 230 are respectively electrically connected with an anode 310 and a cathode 320 of the light-emitting diode chip 300. For example, the first protrusion portion 212 and the corresponding notch 2313 of the first connection sub-portion row have complementary shapes.

In some examples, as shown in FIG. 1 to FIG. 2, the second connection portion 220 comprises a second protrusion portion 222; and the second protrusion portion 222 is located within a notch 2313 at a connection region 2314 of the first connection sub-portion row 2310 connected with the second protrusion portion 222 by the light-emitting diode chip 300. A second electrical contact point 2022 of the second connection portion 220 is located in the second protrusion portion 222; and the second protrusion portion 222 extends into the notch 2313 of the first connection sub-portion row 2310, so that the second electrical contact point 2022 of the second connection portion 220 and a third electrical contact point 2023 of the third connection portion 230 are respectively electrically connected with an anode 310 and a cathode 320 of the light-emitting diode chip 300. For example, the second protrusion portion 222 and the corresponding notch 2313 of the first connection sub-portion row have complementary shapes.

Figure 7:
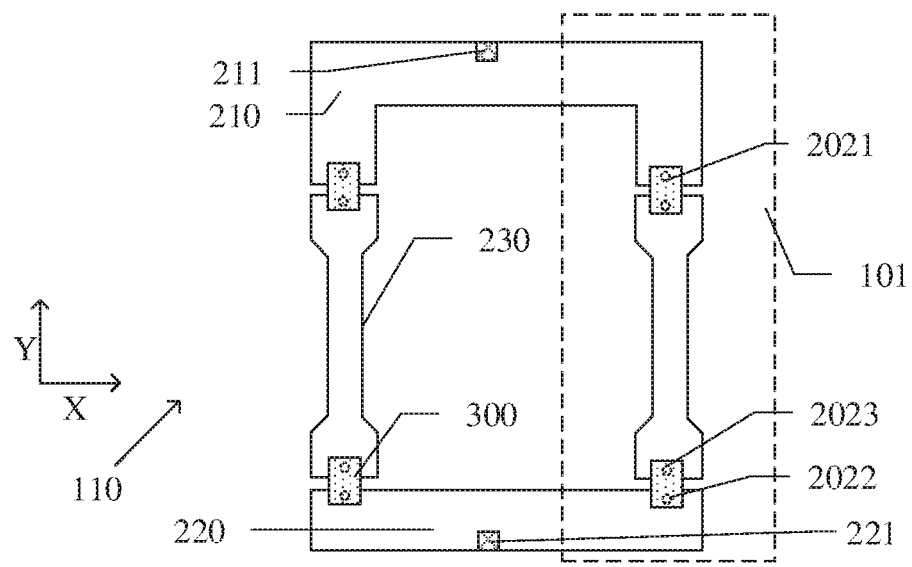
FIG. 7 is a planar structural schematic diagram of a light-emitting unit provided by another example of the embodiment of the present disclosure.

FIG. 7 is a planar structural schematic diagram of a light-emitting unit provided by another example of the embodiment of the present disclosure. As shown in FIG. 7, a difference from the example shown in FIG. 1 is that, a third connection portion 230 in the example comprises only one connection sub-portion; both ends of the third connection portion 230 each are provided with a third electrical contact point 2023; in addition, the third electrical contact point 2023 at one end of the third connection portion 230 and a first electrical contact point 2021 at an end portion of a first connection portion 210 constitute an electrical contact point pair, and the third electrical contact point 2023 at the other end of the third connection portion 230 and a second electrical contact point 2022 of the second connection portion 220 constitute an electrical contact point pair. Thus, in the example, each of the light-emitting sub-units 101 comprises only two light-emitting diode chips 300 connected in series; and a plurality of light-emitting sub-units 101 comprised in the light-emitting unit 110 are connected in parallel by the first connection portion 210 and the second connection portion 220.

The example is not limited thereto. For example, the light-emitting unit 110 can further comprise more than three light-emitting sub-units 101; and the third connection portion 230 in the respective light-emitting sub-units 101 comprises only one connection sub-portion. For example, the third connection portion 230 in the respective light-emitting sub-units 101 comprised in the light-emitting unit 110 can also comprise a plurality of connection sub-portions; each of the connection sub-portions extends along the Y direction; both ends of the connection sub-portions in the Y direction respectively have an electrical contact point; and adjacent connection sub-portions are connected by the light-emitting diode chip 300, that is, the adjacent connection sub-portions are connected head to tail by the light-emitting diode chip 300.

In some examples, as shown in FIG. 1 to FIG. 7, a plurality of light-emitting diode chips 300 in each of the light-emitting units 110 are evenly distributed.

For example, as shown in FIG. 1 to FIG. 7, in a case in which a plurality of light-emitting units are arranged in an array, the plurality of the light-emitting diode chips 300 in the backplane can also be evenly distributed. For example, a minimum distance between two light-emitting diode chips 300 adjacent to each other in the first direction is a first distance; and a minimum distance between two light-emitting diode chips 300 adjacent to each other in the second direction is a second distance. For example, according to the embodiment of the present disclosure, the first distances of the respective positions are all equal to each other, or the second distances of the respective positions are all equal to each other; or the first distances of the respective positions are all equal to each other, and the second distances of the respective positions are all equal to each other.

For example, the positions and connection relationship of the respective connection portions in the connection line 200 on the base substrate 100 are designed according to the positions of the light-emitting diode chips 300. In the embodiment of the present disclosure, in order to implement better current carrying capacity of the respective connection portions; a line width of each of the connection portions in a direction perpendicular to an extension direction of the each of the connection portions should be set greater; however, a distance between adjacent connection portions can be made not less than 15 microns while increasing the line width as wide as possible. For example, the respective connection portions are spread all over the glass substrate in a case in which the distance between the respective connection portions is not less than 15 microns, which can improve flatness of the entire backplane before providing the light-emitting diode chips.

Figure 8:
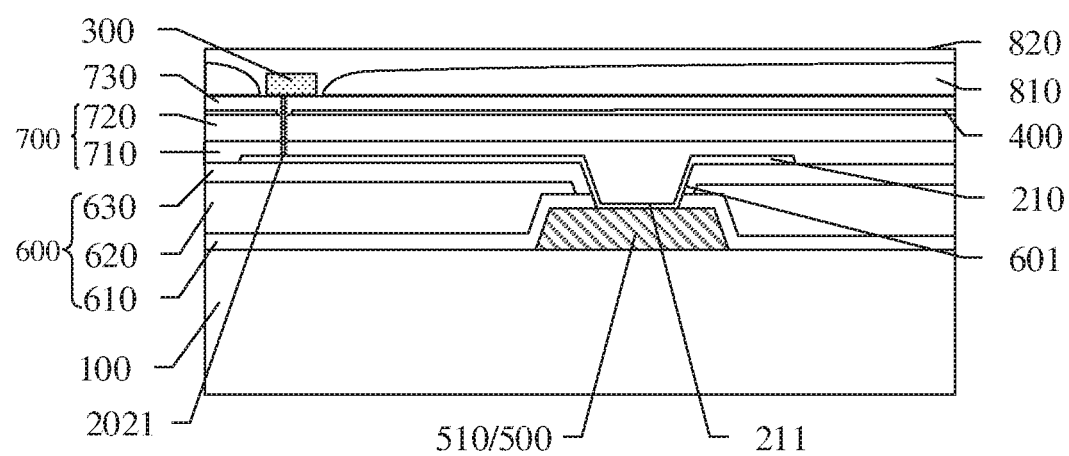
FIG. 8 is a structural schematic diagram of a partial cross section taken along line AA shown in FIG. 6.

FIG. 8 is a structural schematic diagram of a partial cross section taken along line AA shown in FIG. 6. As shown in FIG. 6 and FIG. 8, the backplane further comprises a plurality of wirings 500 parallel to each other; the wirings 500 are located on a side of the connection line 200 facing the base substrate 100, and comprise a plurality of first wirings 510 and a plurality of second wirings 520. The wirings 500, for example, extend along the second direction.

For example, as shown in FIG. 6 and FIG. 8, in the embodiment of the present disclosure, the plurality of the first wirings 510 and the plurality of the second wirings 520 extending along the second direction can be formed by depositing a first conductive layer on the base substrate 100 and patterning the first conductive layer. For example, the first conductive layer can be directly deposited on the glass substrate.

For example, as shown in FIG. 6 and FIG. 8, a first insulation layer 600 is provided between the plurality of the wirings 500 parallel to each other and the connection line 200, to have an insulation function. For example, a thickness of the first insulation layer 600 is relatively thin, which can be on an order of microns. The first insulation layer 600 can comprise a first buffer layer 610, a first resin layer 620, and a first passivation layer 630; and the first resin layer 620 can serve to adhere the first buffer layer 610 and the first passivation layer 630.

For example, after patterning to form the wiring 500, a first insulation material layer can be deposited on the wiring 500, and the first insulation material layer is patterned to form a via hole exposing the first wiring 510 and a via hole exposing the second wiring 520. FIG. 8 schematically shows the via hole exposing the first wiring 510.

For example, if a material of the wiring 500 comprises copper, a material of the first buffer layer 610 in the first insulation layer 600 that is in contact with the wiring 500 comprises silicon nitride, which results in better adhesion between the wiring 500 and the first buffer layer 610.

For example, after patterning to form the first insulation layer 600, a second conductive layer can be deposited on the first insulation layer 600, and the second conductive layer is patterned to form the connection line 200 in the respective light-emitting units.

For example, if a material of the connection line 200 comprises copper, a material of the first passivation layer 630 in the first insulation layer 600 that is in contact with the connection line 200 comprises silicon nitride, which results in better adhesion between the connection line 200 and the first passivation layer 630.

For example, as shown in FIG. 6 and FIG. 8, the first input end 211 of the connection line 200 is connected with the first wiring 510, and the second input end 221 of the connection line 200 is connected with the second wiring 520. That is, the first input end 211 of the first connection portion 210 is electrically connected with the first wiring 510 through the via hole 601 located in the first insulation layer 600, to connect one of the anode and the cathode of the light-emitting diode chip 300 that is electrically connected with the first electrical contact point of the first connection portion 210 to the first wiring 510; the second input end 221 of the second connection portion 220 is electrically connected with the second wiring 520 through the via hole located in the first insulation layer 600, to connect the other of the anode and the cathode of the light-emitting diode chip 300 that is electrically connected with the second electrical contact point of the second connection portion 220 to the second wiring 520.

For example, the base substrate 100 is a glass substrate, and a thickness of the base substrate 100 can be approximately 5 millimeters. Because thicknesses of the respective conductive layers and insulation layers can all be formed relatively thin, a thickness of the glass-based circuit board comprising the connection line in the backplane other than the light-emitting diode chips is not greater than 8 millimeters in the direction perpendicular to the base substrate 100, so that an overall thickness of the backplane to be relatively thin can be ensured.

For example, as shown in FIG. 6, the backplane further comprises a circuit board 900 located on the base substrate 100; and the circuit board 900 is configured to be electrically connected with the first wiring 510 and the second wiring 520.

For example, the circuit board 900 can be a flexible printed circuit board, which is connected with an external power source to perform voltage signal driving on the respective light-emitting units, for example, in region division and/or time division.

For example, the external power source can comprise a 12 V voltage source and a Serial Peripheral Interface (SPI).

For example, the external power source can be connected to the circuit board 900 by a plurality of circuit controllers to implement controlling of the plurality of the light-emitting units in region division. For example, the respective circuit controllers can be connected by signal lines such as power lines, clock lines, and input/output lines (I/O lines) to control operation timing of the respective circuit controllers; and each of the circuit controllers can be electrically connected with one or more light-emitting units to control the light-emitting units to emit light in time division.

In the embodiment of the present disclosure, the backplane can achieve effects of good contrast and high brightness by controlling the light-emitting units in region division.

In some examples, as shown in FIG. 6 and FIG. 8, a thickness of the wiring 500 (e.g., less than 0.1 millimeters) is greater than a thickness of the connection line 200, and widths of the first connection portion 210, the second connection portion 220, and the third connection portion 230 comprised in the connection line 200 are all greater than a width of the wiring 500. The plurality of the wirings 500 parallel to each other are distributed on the base substrate 100 to connect the anodes and the cathodes of light-emitting diode chips 300 in the respective light-emitting units to the circuit board 900; and in a case in which a distance between adjacent wirings 500 is ensured to meet electrical safety requirements (e.g., not less than 15 microns), the line width of the wiring 500 can be set relatively narrow, so that the number of the light-emitting units can be more. Meanwhile, in order to ensure current carrying capacity of the wiring 500, the thickness of the wiring 500 can be set relatively great. For example, line widths of the wirings and the respective connection portions can be obtained according to temperature increasement of materials thereof, that is, a line width can be obtained according to relationship between temperature increasement of a material and a load current. Because the insulation layer located between the wiring and the connection line is relatively thin, when designing the line width of the connection portion in the connection line, it should also be considered to avoid signal crosstalk due to a relatively large overlapping area of the wiring and the connection line.

For example, as shown in FIG. 8, the backplane further comprises a reflective layer 400 located between the connection line 200 and the plurality of the light-emitting diode chips 300. A second insulation layer 700 is further provided between the reflective layer 400 and the connection line 200 to isolate the reflective layer 400 and the connection line 200 from each other.

For example, the reflective layer 400 can be a metal layer having a smooth surface to reflect light. The reflective layer according to the embodiment of the present disclosure is used to reflect light emitted by the light-emitting diode chip, so as to improve light efficiency. As compared with a method of providing photosensitive white oil on a general PCB board to reflect light, the method of providing the reflective layer according to the embodiment of the present disclosure can achieve better light reflecting effect, and improve light efficiency.

For example, as shown in FIG. 8, the second insulation layer 700 comprises a second buffer layer 710 and a second resin layer 720.

For example, a material of the connection line 200 comprises copper, and a material of the second buffer layer 710 in the second insulation layer 700 that is in contact with the connection line 200 comprises silicon nitride, which results in better adhesion between the connection line 200 and the second buffer layer 710.

For example, after forming the connection line 200, a second insulation material layer can be deposited on the connection line 200; the second insulation material layer is patterned to form the second insulation layer 700 having a via hole; and the via hole in the second insulation layer 700 is used to expose the connection line 200.

For example, after forming the second insulation layer 700, a reflective material layer is deposited on the second insulation layer 700, and the reflective material layer is patterned to form the reflective layer 400 exposing the connection line 200. That is, the reflective layer 400 exposes the via hole provided in the second insulation layer 700 to ensure that the subsequent light-emitting diode chip can be electrically connected with the connection line 200 through the via hole provided in the second insulation layer 700.

For example, a third insulation layer 730 is further provided on a side of the reflective layer 400 away from the second insulation layer 700 to insulate the reflective layer 400 from the light-emitting diode chip 300.

In some examples, as shown in FIG. 8, the backplane further comprises a white glue layer 810 located on a side of the reflective layer 400 away from the base substrate 100; and the white glue layer 810 has an opening exposing the light-emitting diode chip 300.

For example, after electrical connection between the light-emitting diode chip 300 and the connection line 200 is completed, the white glue layer 810 can be formed. For example, before forming the white glue layer 810, a surface in a position surrounding the light-emitting diode chip 300 and closely adjacent to the light-emitting diode chip 300 and a position outside the region can be subjected to a treatment, for example, respectively subjected to hydrophobization and hydrophilization, so that the white glue layer 810 sprayed between adjacent light-emitting diode chips 300 does not cover the light-emitting diode chip 300 during a diffusion process. For example, the white glue layer 810 and the light-emitting diode chip 300 are both provided on a same layer. For example, as shown in FIG. 8, the white glue layer 810 and the light-emitting diode chip 300 are both located on the third insulation layer 730.

For example, as shown in FIG. 8, the region surrounding the light-emitting diode chip 300 can expose the reflective layer 400, so that the reflective layer 400 reflects light emitted by the light-emitting diode chip 300, so as to improve light efficiency. A thickness of the white glue layer 810 located between light-emitting diode chips 300 is relatively great so that a distance between a flat surface of the white glue layer 810 away from the base substrate 100 and the base substrate 100 is greater than a distance between a surface of the light-emitting diode chip 300 away from the base substrate 100 and the base substrate 100, and, thus, the white glue layer surrounding the light-emitting diode chip can also have a function of reflecting light to further increase reflectivity of the backplane.

For example, as shown in FIG. 8, the backplane further comprises a transparent layer 820 located on a side of the white glue layer 810 away from the base substrate 100 to cover the white glue layer 810 and the light-emitting diode chip 300, thereby protecting the light-emitting diode chip 300.

For example, as shown in FIG. 6 and FIG. 8, the base substrate 100 can comprise a plurality of coating regions extending along the second direction and closely arranged in the first direction; and coating can be completed by sequentially coating the transparent layer 820 in each coating region.

Figure 9:
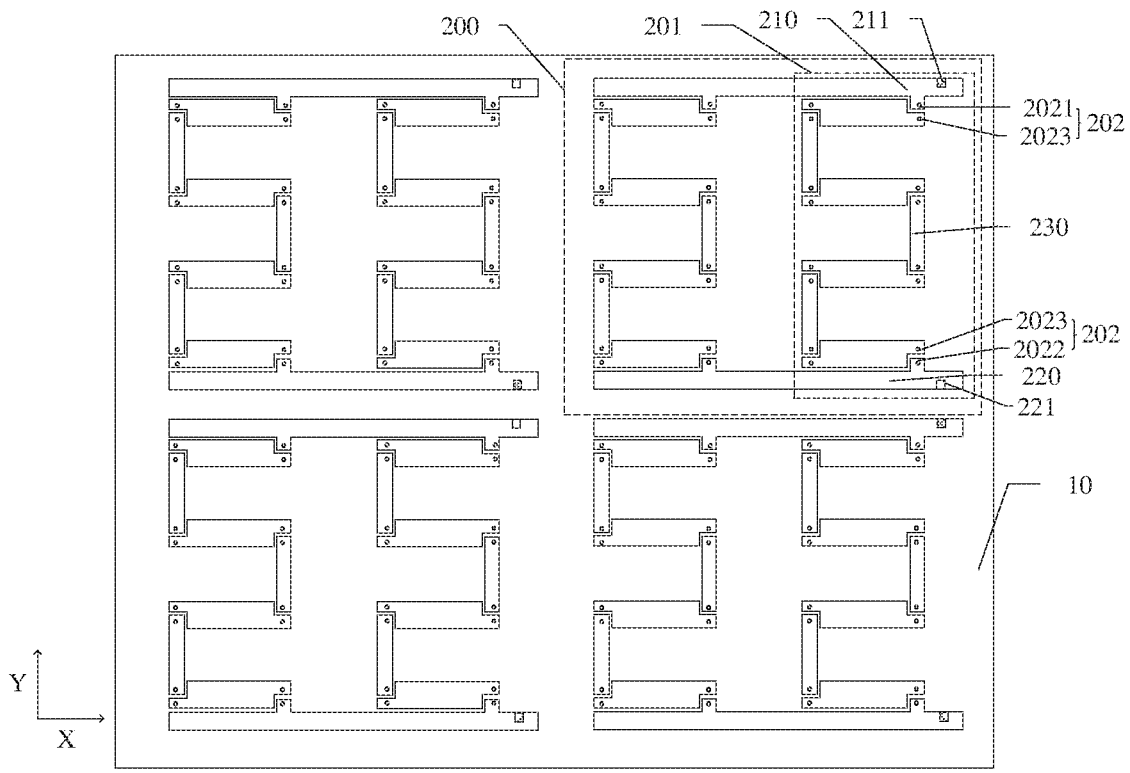
FIG. 9 is a partial planar structural schematic diagram of a glass-based circuit board provided by another embodiment of the present disclosure.
Figure 10:
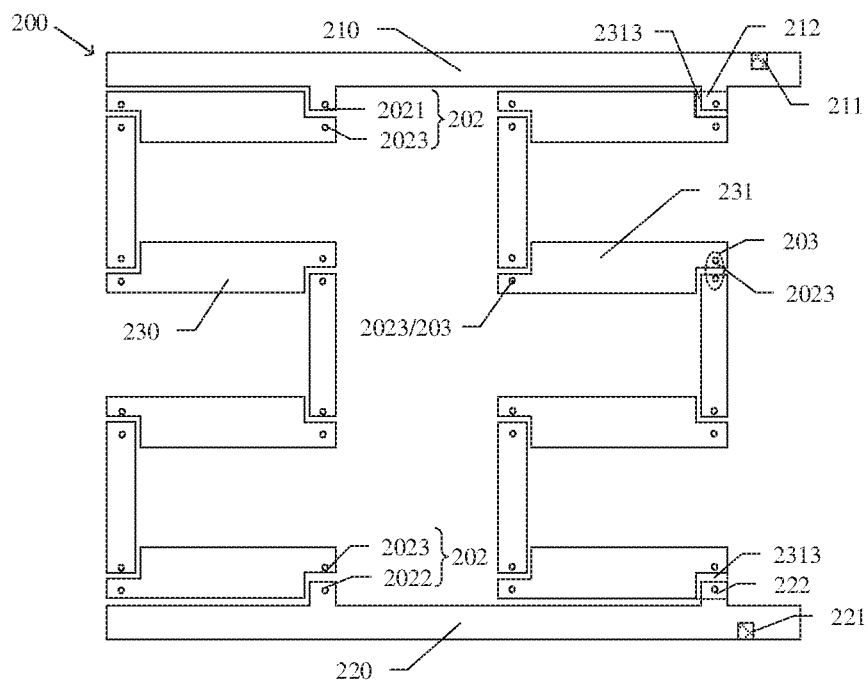
FIG. 10 is a planar structural schematic diagram of a connection line unit in the glass-based circuit board shown in FIG. 9.

Another embodiment of the present disclosure provides a glass-based circuit board, FIG. 9 is a planar structural schematic diagram of a glass-based circuit board provided by another embodiment of the present disclosure; and FIG. 10 is a planar structural schematic diagram of the connection line unit in the glass-based circuit board shown in FIG. 9. As shown in FIG. 9 to FIG. 10, the glass-based circuit board comprises a glass substrate 10 and a plurality of connection line units 200 arranged in an array on the glass substrate 10. Each of the connection line units 200 comprises at least one connection line sub-unit 201; the connection line sub-unit 201 comprises a plurality of electrical contact point pairs; each of the electrical contact point pairs is configured to be connected with an anode and a cathode of a light-emitting diode chip in one-to-one correspondence. The connection line sub-unit 201 shown in FIG. 9 comprises connection portions that connect the plurality of the light-emitting diode chips in the light-emitting sub-unit shown in FIG. 1 in series. The glass-based circuit board provided by this embodiment can be a circuit board of the backplane shown in FIG. 1 before providing the light-emitting diode chip.

The glass-based circuit board according to the embodiment of the present disclosure replaces a general PCB board, for example, a PCB board used for electrically connecting the light-emitting diode chips in a backlight source, which can overcome the problem of poor heat dissipation performance of a general PCB substrate; in addition, because the glass substrate is not easily deformed, only one large-sized glass substrate is required to be used in a process of fabricating a large-sized backplane, without splicing a plurality of substrates, which can reduce fabrication costs and driving costs.

In some examples, as shown in FIG. 9 and FIG. 10, the connection line sub-unit 201 comprises a first connection portion 210 and a second connection portion 220; the first connection portion 210 comprises a first input end 211; the second connection portion comprises a second input end 221; and the first connection portion 210 and the second connection portion 220 respectively comprise an electrical contact point. For example, the first connection portion 210 comprises a first electrical contact point 2021; and the second connection portion 220 comprises a second electrical contact point 2022. Referring to FIG. 9 to FIG. 10 and FIG. 1 to FIG. 2, the connection line sub-unit 201 is configured to connect a plurality of light-emitting diode chips 300 in series.

In some examples, as shown in FIG. 9 and FIG. 10, the connection line sub-unit 201 further comprises a third connection portion 230; and both ends of the third connection portion 230 each comprise one electrical contact point, for example, both ends of the third connection portion 230 each comprise a third electrical contact point 2023. A third electrical contact point 2023 at one end of the third connection portion 230 and the first electrical contact point 2021 of the first connection portion 210 constitute an electrical contact point pair 202; a third electrical contact point 2023 at the other end of the third connection portion 230 and the second electrical contact point 2022 of the second connection portion 220 constitute an electrical contact point pair 202. Referring to FIG. 9 to FIG. 10 and FIG. 1 to FIG. 2, each of the electrical contact point pairs 202 can be respectively connected with an anode 310 and a cathode 320 of a light-emitting diode chip 300 in one-to-one correspondence.

For example, as shown in FIG. 9 to FIG. 10, the first connection portion 210, the second connection portion 220 and the third connection portion 230 are provided in a same layer and made of a same material. For example, materials of the respective connection portions can all be copper, but are not limited thereto, and can also be other conductive materials.

In some examples, as shown in FIG. 9 and FIG. 10, in each of the connection line sub-units 201, a third connection portion 230 comprises a plurality of connection sub-portions 231; and both ends of each of the connection sub-portions 231 each comprise one electrical contact point, for example, a third electrical contact point 2023. The plurality of the connection sub-portions 231 are adjacent head to tail, so that adjacent electrical contact points 2023 of adjacent connection sub-portions 231 constitute an electrical contact point pair 203. The above-described expression that "the plurality of the connection sub-portions are adjacent head to tail" refers to that the plurality of the connection sub-portions each comprise a first end and a second end; a first end of one connection sub-portion of two adjacent connection sub-portions is adjacent to a second end of the other connection sub-portion of the two adjacent connection sub-portions; and an electrical contact point located at a first end of the one connection sub-portion and an electrical contact point located at a second end of the other connection sub-portion constitute an electrical contact point pair.

Referring to FIG. 9 to FIG. 10 and FIG. 1 to FIG. 2, both ends of each of the connection sub-portions 231 each comprise a third electrical contact point 2023 for electrical connecting with an anode 310 or a cathode 320 of a light-emitting diode chip 300; two electrical contact points in each of the electrical contact point pairs 203 can be respectively connected with an anode 310 and a cathode 320 of one light-emitting diode chip 300 in one-to-one correspondence, so that the plurality of the connection sub-portions 231 are connected head to tail by the light-emitting diode chips 300. That is, the plurality of the connection sub-portions 231 are connected head to tail sequentially by the light-emitting diode chips 300.

Figure 11:
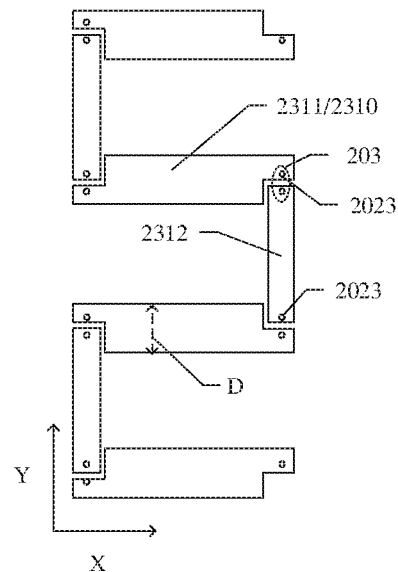
FIG. 11 is a planar structural schematic diagram of a third connection portion in the connection line sub-unit of FIG. 10.

FIG. 11 is a schematic diagram of the third connection portion in the connection line sub-unit of FIG. 10; and FIG. 4 is a schematic diagram of the first connection sub-portion in FIG. 11.

In some examples, as shown in FIG. 9 to FIG. 11 and FIG. 4, the plurality of the connection sub-portions 231 comprise a first connection sub-portion 2311 and a second connection sub-portion 2312. The first connection sub-portion 2311 extends along a first direction (an X direction) parallel to the glass substrate 10; the first connection sub-portion 2311 has a shape in which notches 2313 are formed at two corners of a substantially rectangular shape that are opposite to each other in a diagonal direction; the first connection sub-portion 2311 comprises connection regions 2314 corresponding to the notches 2313; and an electrical contact point 2023 of the first connection sub-portion 2311 is located on a side of the connection region 2314 facing the notch 2313. The first connection sub-portion according to this embodiment has same features as the first connection sub-portion shown in FIG. 3 to FIG. 4, which will be omitted here.

In some examples, as shown in FIG. 9 to FIG. 11, the second connection sub-portion 2312 extends along a second direction (a Y direction) parallel to the glass substrate 100 and intersecting with the first direction; the electrical contact points 2023 of the second connection sub-portion 2312 are located at both end portions of the second connection sub-portion 2312 in the second direction. An electrical contact point pair 203 constituted by an electrical contact point 2023 of the second connection sub-portion 2312 and an electrical contact point 2023 of an adjacent first connection sub-portion 2311 is configured to connect a plurality of the light-emitting diode chips 300 shown in FIG. 1 in series. The second connection sub-portion according to this embodiment has same features as the second connection sub-portion shown in FIG. 3 to FIG. 4, which will be omitted here.

In some examples, as shown in FIG. 9 to FIG. 11, the connection line sub-unit 201 comprises a plurality of first connection sub-portion rows 2310 extending along the first direction and arranged in the second direction; each of the first connection sub-portion rows 2310 comprises at least one first connection sub-portion 2311. FIG. 11 schematically shows that the first connection sub-portion row 2310 comprises one first connection sub-portion 2311. Two end portions of the second connection sub-portion 2312 are respectively located in the notches 2313 at end portions of adjacent first connection sub-portion rows 2310, so that electrical contact points 2023 at the two end portions of the second connection sub-portion 2312 each constitute an electrical contact point pair 203 with an electrical contact point 2023 of an adjacent first connection sub-portion row 2310. The second connection sub-portions 2312 forming the electrical contact point pairs 203 with a same first connection sub-portion row 2310 are respectively located on both sides of the first connection sub-portion row 2310 in the second direction and are respectively located at both ends of the first connection sub-portion row 2310 in the first direction. Referring to FIG. 9 to FIG. 10 and FIG. 1, the two end portions of the second connection sub-portions 2312 are respectively located in the notches 2313 opposite to each other at the end portions of the adjacent two first connection sub-portion rows 2310, to connect the adjacent first connection sub-portion rows 2310 by the light-emitting diode chips 300. In addition, the second connection sub-portions 2312 connected with a same first connection sub-portion row 2310 by the light-emitting diode chips 300 are respectively located on both sides of the first connection sub-portion row 2310 in the second direction and are respectively located at both ends of the first connection sub-portion row 2310 in the first direction. The first connection sub-portion row in the example shown in FIG. 11 has same features as the first connection sub-portion row shown in FIG. 3, the position relationship between the first connection sub-portion row and the second connection sub-portion shown in FIG. 11 is the same as the position relationship between the first connection sub-portion row and the second connection sub-portion shown in FIG. 3, which will be omitted here.

Figure 12:
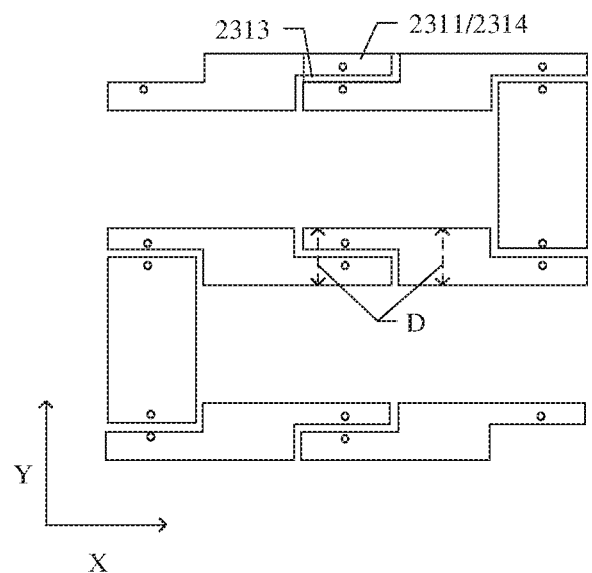
FIG. 12 is a partial planar structural schematic diagram of a connection line sub-unit provided by another example of the embodiment of the present disclosure.

FIG. 12 is a partial structural schematic diagram of a connection line sub-unit provided by another example of the embodiment of the present disclosure. In some examples, as shown in FIG. 12, each of the first connection sub-portion rows 2310 comprises a plurality of first connection sub-portions 2311; and a connection region 2314 of one first connection sub-portion 2311 of adjacent first connection sub-portions 2311 is located in the notch 2313 of the other first connection sub-portion 2311 of the adjacent first connection sub-portions 2311. Referring to FIG. 5 and FIG. 12, the adjacent connection regions 2314 are connected by the light-emitting diode chip 300. The first connection sub-portion row according to this embodiment has same features as the first connection sub-portion row shown in FIG. 5, which will be omitted here.

In some examples, as shown in FIG. 11 to FIG. 12, except the connection regions 2314 located at both ends of the first connection sub-portion row 2310, a size D of the first connection sub-portion row 2310 in respective positions in the first direction is substantially equal along the second direction.

In some examples, as shown in FIG. 9 to FIG. 10, at least one connection line sub-unit 201 comprises a plurality of connection line sub-units 201; and the plurality of the connection line sub-units 201 share the first connection portion 210 and the second connection portion 220. Referring to FIG. 1 to FIG. 2 and FIG. 9 to FIG. 10, the plurality of the connection line sub-units 201 share the first connection portion 210 and the second connection portion 220, so as to be connected in parallel, that is, the plurality of the connection line sub-units 201 share the first connection portion 210 and the second connection portion 220 so that the plurality of the light-emitting sub-units 101 are connected in parallel.

In some examples, as shown in FIG. 9 to FIG. 12, a first connection portion 210 comprises a first protrusion portion 212, an electrical contact point 2021 of the first connection portion 210 is located on the first protrusion portion 212, and the first protrusion portion 212 is located within a notch 2313 corresponding to a connection region 2314 of a first connection sub-portion row 2310 adjacent to the first protrusion portion 212, so that an electrical contact point 2021 on the first protrusion portion 212 and an electrical contact point 2023 in the connection region 2314 of the first connection sub-portion row 2310 constitute an electrical contact point pair 202; a second connection portion 220 comprises a second protrusion portion 222, an electrical contact point 2022 of the second connection portion 220 is located on the second protrusion portion 222, and the second protrusion portion 222 is located within a notch 2313 corresponding to a connection region 2314 of a first connection sub-portion row 2310 adjacent to the second protrusion portion 222, so that the electrical contact point 2022 on the second protrusion portion 222 and an electrical contact point 2023 in the connection region 2314 of the first connection sub-portion row 2310 constitute an electrical contact point pair 202.

Referring to FIG. 1 to FIG. 6 and FIG. 9 to FIG. 12, the first protrusion portion 212 of the first connection portion 210 extends into the notch 2313 of the first connection sub-portion row 2310, so that the first electrical contact point 2021 of the first connection portion 210 and the third electrical contact point 2023 of the third connection portion 230 are respectively electrically connected with an anode 310 and a cathode 320 of a light-emitting diode chip 300. The second protrusion portion 222 of the second connection portion 220 extends into the notch 2313 of the first connection sub-portion row 2310, so that the second electrical contact point 2022 of the second connection portion 220 and the third electrical contact point 2023 of the third connection portion 230 are respectively electrically connected with an anode 310 and a cathode 320 of a light-emitting diode chip 300. The position and connection relationship between the first connection portion and the first connection sub-portion row according to this embodiment is the same as the position and connection relationship between the first connection portion and the first connection sub-portion row shown in FIG. 1 to FIG. 6, and the position and connection relationship between the second connection portion and the first connection sub-portion row according to this embodiment is the same as the position and connection relationship between the second connection portion and the first connection sub-portion row shown in FIG. 1 to FIG. 6, which will be omitted here.

For example, the connection line unit of the glass-based circuit board provided by this embodiment can further comprise the connection portion shown in FIG. 7; FIG. 7 and the related description can be referred to for a specific structure of the connection line unit, which will be omitted here.

For example, the glass-based circuit board provided by this embodiment further comprises a plurality of wirings 500 parallel to each other on a side of the connection line unit 200 facing the base substrate 100 (i.e., the glass substrate 10) as shown in FIG. 6 and FIG. 8; and the wirings 500 comprise a plurality of first wirings 510 and a plurality of second wirings 520. The first input end 211 of the connection line unit 200 is connected with the first wiring 510, and the second input end 221 of the connection line unit 200 is connected with the second wiring 520. The wiring 500, for example, extends along the second direction. The wiring provided by this embodiment has same features as the wiring shown in FIG. 6 and FIG. 8, which will be omitted here.

For example, the glass-based circuit board provided by this embodiment further comprises a first insulation layer 600 located between the wirings 500 and the connection line unit 200 shown in FIG. 6 and FIG. 8, to have an insulation function. The first insulation layer provided by this embodiment has same features as the first insulation layer shown in FIG. 6 and FIG. 8, which will be omitted here.

For example, the glass-based circuit board provided by this embodiment further comprises a reflective layer 400 located between the connection line unit 200 and the plurality of light-emitting diode chips 300 shown in FIG. 6 and FIG. 8. The reflective layer provided by this embodiment has same features and functions as the reflective layer shown in FIG. 6 and FIG. 8, which will be omitted here.

For example, the glass-based circuit board provided by this embodiment further comprises a second insulation layer 700 located between the reflective layer 400 and the connection line unit 200 shown in FIG. 6 and FIG. 8, to isolate the reflective layer 400 and the connection line unit 200 from each other. The second insulation layer provided by this embodiment has same features as the second insulation layer shown in FIG. 6 and FIG. 8, which will be omitted here.

For example, the glass-based circuit board provided by this embodiment can further comprise a printed circuit board 900 shown in FIG. 6; and the circuit board is configured to be electrically connected with the first wiring and the second wiring, to implement driving the connection line unit in region division. The circuit board provided by this embodiment has same features and functions as the circuit board shown in FIG. 6, which will be omitted here.

In some examples, as shown in FIG. 9 to FIG. 12, the electrical contact point pairs in each of the connection line units 200 are evenly distributed so that the evenly distributed plurality of the light-emitting diode chips 300 shown in FIG. 1 to FIG. 6 can be connected with the plurality of the electrical contact point pairs in one-to-one correspondence.

For example, the positions of the respective connection portions and the positions of the respective electrical contact point pairs in the connection line unit 200 on the glass-based circuit board according to the embodiment of the present disclosure are designed according to the positions of the light-emitting diode chips 300. In the embodiment of the present disclosure, in order to implement better current carrying capacity of the respective connection portions, a line width of the respective connection portions in a direction perpendicular to an extension direction of the respective connection portions can be set greater; however, it can be considered to make a distance between adjacent connection portions not less than 15 microns while increasing the line width as wide as possible. For example, the respective connection portions are spread all over the glass substrate in a case in which a distance between the connection portions is not less than 15 microns, which can ensure flatness of the entire glass-based circuit board.

For example, in a direction perpendicular to the glass substrate 10, a thickness of the glass-based circuit board is not greater than 8 millimeters, to be capable to ensure that the thickness of the backplane including the above-described glass-based circuit board is relatively thin.

The glass-based circuit board according to the above-described embodiment of the present disclosure can be a circuit board for connecting light-emitting diodes in the backplane according to the above-described embodiment, and therefore, the related description of the glass-based circuit board according to the embodiment of the present disclosure can all be applied to the backplane according to the embodiment of the present disclosure, and the related description of the backplane according to the embodiment of the present disclosure can all be applied to the glass-based circuit board according to the embodiment of the present disclosure as well.

The glass-based circuit board provided by the embodiment of the present disclosure can be applied to a backlight source, and can also be applied to a display panel. In addition, the backplane provided by embodiments of the present disclosure can reduce the fabrication costs and the driving costs.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

The invention claimed is:

1. A backplane, comprising:
a base substrate;
a plurality of light-emitting units, arranged in an array on the base substrate,
wherein each of the plurality of the light-emitting units comprises at least one light-emitting sub-unit; the at least one light-emitting sub-unit comprises a connection line and a plurality of light-emitting diode chips connected with the connection line; the plurality of the light-emitting diode chips are located on a side of the connection line away from the base substrate; and the plurality of the light-emitting diode chips in the at least one light-emitting sub-unit are connected in series,
wherein in each of the light-emitting sub-units, the connection line comprises a first connection portion and a second connection portion; the first connection portion comprises a first input end; the second connection portion comprises a second input end; and the first connection portion and the second connection portion respectively comprise an electrical contact point;
the connection line further comprises a third connection portion; both ends of the third connection portion respectively comprise an electrical contact point; the electrical contact point at one end of the third connection portion and the electrical contact point of the first connection portion constitute an electrical contact point pair; the electrical contact point at the other end of the third connection portion and the electrical contact point of the second connection portion constitute an electrical contact point pair; and each of the electrical contact point pairs is respectively connected with an anode and a cathode of one of the plurality of the light-emitting diode chips in one-to-one correspondence,
wherein in each of the light-emitting sub-units, the third connection portion comprises a plurality of connection sub-portions; both ends of each of the connection sub-portions respectively comprise an electrical contact point; the electrical contact points at adjacent ends of adjacent connection sub-portions constitute an electrical contact point pair; each of the electrical contact point pairs is respectively connected with an anode and a cathode of one of the plurality of the light-emitting diode chips in one-to-one correspondence; and the plurality of the connection sub-portions are connected in series by the light-emitting diode chips,
wherein the plurality of the connection sub-portions comprise a first connection sub-portion and a second connection sub-portion, the first connection sub-portion extends along a first direction parallel to the base substrate;
the first connection sub-portion has a shape in which notches are formed at two corners of a substantially rectangular shape that are opposite to each other in a diagonal direction; the first connection sub-portion comprises connection regions corresponding to the notches; and the electrical contact point of the first connection sub-portion is located on a side of the connection region facing the notch,
the second connection sub-portion extends along the second direction parallel to the base substrate and intersecting with the first direction; the electrical contact points of the second connection sub-portion are located at both end portions of the second connection sub-portion in the second direction.

2. The backplane according to claim 1, wherein the light-emitting sub-unit comprises a plurality of first connection sub-portion rows extending along the first direction and arranged in the second direction; each of the first connection sub-portion rows comprises at least one first connection sub-portion; two end portions of the second connection sub-portion are respectively located in notches opposite to each other at end portions of adjacent first connection sub-portion rows, so that the adjacent first connection sub-portion rows are connected with each other by the second connection sub-portion and the light-emitting diode chips,
the second connection sub-portions connected with a same first connection sub-portion row by the light-emitting diode chips are respectively located on both sides of the same first connection sub-portion row in the second direction and are respectively located at both ends of the same first connection sub-portion row in the first direction.

3. The backplane according to claim 2, wherein each of the first connection sub-portion rows comprises a plurality of the first connection sub-portions; and a connection region of one first connection sub-portion of adjacent first connection sub-portions is located in the notch of the other first connection sub-portion of the adjacent first connection sub-portions, so that the adjacent connection regions are electrically connected by the light-emitting diode chip.

4. The backplane according to claim 2, wherein each of the first connection sub-portion rows comprises a first end portion and a second end portion; the first end portions of the plurality of the connection sub-portion rows are aligned in the second direction; the second end portions of the plurality of the first connection sub-portion rows are aligned in the second direction; and the plurality of the first connection sub-portion rows and the second connection sub-portions are integrally connected in a square wave shape.

5. The backplane according to claim 2, wherein the first connection portion comprises a first protrusion portion; the first protrusion portion is located within the notch at the connection region of the first connection sub-portion row connected with the first protrusion portion by the light-emitting diode chip; the second connection portion comprises a second protrusion portion; and the second protrusion portion is located within the notch at the connection region of the first connection sub-portion row connected with the second protrusion portion by the light-emitting diode chip.

6. The backplane according to claim 1, wherein the at least one light-emitting sub-unit comprises a plurality of light-emitting sub-units; and the plurality of the light-emitting sub-units of each of the light-emitting units share the first connection portion and the second connection portion, so that the plurality of the light-emitting sub-units are connected in parallel.

7. The backplane according to claim 1, further comprising:
a reflective layer, located between the connection line and the light-emitting diode chip.

8. The backplane according to claim 7, further comprising:
a plurality of wirings parallel to each other, located on a side of the connection line facing the base substrate, and including a plurality of first wirings and a plurality of second wirings;
a first insulation layer between the plurality of the wirings parallel to each other and the connection line;
a second insulation layer between the reflective layer and the connection line, to isolate the reflective layer and the connection line from each other,
wherein the first input end of the connection line is connected with the first wiring, and the second input end of the connection line is connected with the second wiring.

9. The backplane according to claim 8, wherein a thickness of the wiring is greater than a thickness of the connection line, and widths of both of the first connection portion and the second connection portion are greater than a width of the wiring.

10. A glass-based circuit board, comprising:
a glass substrate; and
a plurality of connection line units, arranged in an array on the glass substrate;
wherein, each of the connection line units comprises at least one connection line sub-unit; the connection line sub-unit comprises a plurality of electrical contact point pairs; each of the electrical contact point pairs is configured to be connected with an anode and a cathode of a light-emitting diode chip in one-to-one correspondence, so that a plurality of light-emitting diode chips connected with the plurality of electrical contact point pairs are connected in series,
wherein the connection line sub-unit comprises a first connection portion and a second connection portion; the first connection portion comprises a first input end; the second connection portion comprises a second input end; and the first connection portion and the second connection portion respectively comprise an electrical contact point;
the connection line sub-unit further comprises a third connection portion; both ends of the third connection portion respectively comprise an electrical contact point; the electrical contact point at one end of the third connection portion and the electrical contact point of the first connection portion constitute the electrical contact point pair; the electrical contact point at the other end of the third connection portion and the electrical contact point of the second connection portion constitute the electrical contact point pair,
wherein in each of the connection line sub-units, the third connection portion comprises a plurality of connection sub-portions; both ends of each of the connection sub-portions respectively comprise an electrical contact point; the plurality of the connection sub-portions are adjacent head to tail, so that adjacent electrical contact points of the adjacent connection sub-portions constitute the electrical contact point pair,
wherein the plurality of the connection sub-portions comprise a first connection sub-portion and a second connection sub-portion, the first connection sub-portion extends along a first direction parallel to the glass substrate;
the first connection sub-portion has a shape in which notches are formed at two corners of a substantially rectangular shape that are opposite to each other in a diagonal direction; the first connection sub-portion comprises connection regions corresponding to the notches; and the electrical contact point of the first connection sub-portion is located on a side of the connection region facing the notch,
the second connection sub-portion extends along a second direction parallel to the glass substrate and intersecting with the first direction; electrical contact points of the second connection sub-portion are located at both end portions of the second connection sub-portion in the second direction.

11. The glass-based circuit board according to claim 10, wherein the connection line sub-unit comprises a plurality of first connection sub-portion rows extending along the first direction and arranged in the second direction; each of the first connection sub-portion rows comprises at least one first connection sub-portion; two end portions of the second connection sub-portion are respectively located in notches at end portions of adjacent first connection sub-portion rows, so that the electrical contact points at the two end portions of the second connection sub-portion respectively constitute the electrical contact point pair with the electrical contact point of an adjacent first connection sub-portion row,
the second connection sub-portions forming the electrical contact point pairs with a same first connection sub-portion row are respectively located on both sides of the first connection sub-portion row in the second direction and are respectively located at both ends of the first connection sub-portion row in the first direction.

12. The glass-based circuit board according to claim 11, wherein each of the first connection sub-portion rows comprises a plurality of first connection sub-portions; and the connection region of one first connection sub-portion of adjacent first connection sub-portions is located in the notch of the other first connection sub-portion.

13. The glass-based circuit board according to claim 11, wherein the first connection portion comprises a first protrusion portion, the electrical contact point of the first connection portion is located on the first protrusion portion, and the first protrusion portion is located within the notch corresponding to the connection region of the first connection sub-portion row adjacent to the first connection portion, so that the electrical contact point on the first protrusion portion and the electrical contact point in the connection region of the first connection sub-portion row constitute the electrical contact point pair; the second connection portion comprises a second protrusion portion, the electrical contact point of the second connection portion is located on the second protrusion portion, and the second protrusion portion is located within the notch corresponding to the connection region of the first connection sub-portion row adjacent to the second protrusion portion, so that the electrical contact point on the second protrusion portion and the electrical contact point in the connection region of the first connection sub-portion row constitute the electrical contact point pair.

14. The glass-based circuit board according to claim 8, wherein the at least one connection line sub-unit comprises a plurality of connection line sub-units; and the plurality of the connection line sub-units in each of the connection line units share the first connection portion and the second connection portion.

* * * * *